(12) United States Patent
Wang

(10) Patent No.: US 11,373,558 B2
(45) Date of Patent: Jun. 28, 2022

(54) STRETCHABLE ORGANIC LIGHT EMITTING DIODE DISPLAY PANEL

(71) Applicant: Wuhan China Star Optoelectronics Semiconductor Display Technology Co., Ltd., Wuhan (CN)

(72) Inventor: Lei Wang, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 186 days.

(21) Appl. No.: 16/631,181

(22) PCT Filed: Dec. 5, 2019

(86) PCT No.: PCT/CN2019/123239
§ 371 (c)(1),
(2) Date: Jan. 15, 2020

(87) PCT Pub. No.: WO2021/082178
PCT Pub. Date: May 6, 2021

(65) Prior Publication Data
US 2021/0358343 A1    Nov. 18, 2021

(30) Foreign Application Priority Data

Oct. 28, 2019  (CN) .......................... 201911029677.7

(51) Int. Cl.
*G09F 9/30* (2006.01)
*H01L 27/32* (2006.01)
(Continued)

(52) U.S. Cl.
CPC .......... *G09F 9/301* (2013.01); *H01L 27/3246* (2013.01); *H01L 27/3276* (2013.01);
(Continued)

(58) Field of Classification Search
None
See application file for complete search history.

(56) References Cited

U.S. PATENT DOCUMENTS

| 10,466,746 B2 | 11/2019 | Hong et al. |
| 2019/0280077 A1 | 9/2019 | Park et al. |

(Continued)

FOREIGN PATENT DOCUMENTS

| CN | 109830614 | 5/2019 |
| CN | 109920803 | 6/2019 |
| CN | 110350014 | 10/2019 |

*Primary Examiner* — J. E. Schoenholtz

(57) ABSTRACT

An OLED display panel includes a display panel body, first hole units, bridge sets, and island sets. The display panel body includes a flexible underlay substrate. The first hole units are defined through the display panel body, each first hole unit includes at least one through hole region intersected, a middle through hole region and two side through hole regions, the middle through hole region and two side through hole regions are longitudinal, connected to two ends of the middle through hole region, and perpendicular to the middle through hole region. Each hole unit is a stretchable unit. Each bridge set is formed on the display panel body and is a wire unit. Each island set is formed on the display panel body and is a light emitting and displaying unit. The first hole unit including the through hole region intersected can improve a stretchable amount of the display panel.

12 Claims, 2 Drawing Sheets

(51) Int. Cl.
  *H01L 51/00* (2006.01)
  *H01L 51/52* (2006.01)
(52) U.S. Cl.
  CPC ...... *H01L 51/0097* (2013.01); *H01L 51/5237* (2013.01); *H01L 2251/5338* (2013.01)

(56) References Cited

U.S. PATENT DOCUMENTS

2019/0324312 A1* 10/2019 Cao ................... G02F 1/136286
2020/0409419 A1* 12/2020 He .......................... G09F 9/301
2021/0257434 A1*  8/2021 Xie ..................... H01L 51/5253

* cited by examiner

STRETCHABLE ORGANIC LIGHT EMITTING DIODE DISPLAY PANEL

RELATED APPLICATIONS

This application is a National Phase of PCT Patent Application No. PCT/CN2019/123239 having International filing date of Dec. 5, 2019, which claims the benefit of priority of Chinese Patent Application No. 201911029677.7 filed on Oct. 28, 2019. The contents of the above applications are all incorporated by reference as if fully set forth herein in their entirety.

FIELD AND BACKGROUND OF THE INVENTION

The present invention relates to a stretchable organic light emitting diode (OLED) display panel comprising hole units each of which including at least one through hole region intersected to be able to increase stretching amount of the OLED display panel while sufficient island units are allowed. In other words, light emitting and displaying units are distributed on the OLED display panel to maintain a high resolution of the stretchable OLED display panel while a stretchable function thereof is performed.

A conventional stretchable organic light emitting diode (OLED) display panel, needs island units, bridge units, hole units. etc. disposed therein in its structure. The hole units are S-shaped and occupy extreme areas of the display panel. However, pixels cannot be distributed on places of the hole units (regions defined with holes). The S-shaped hole units cause several places on the OLED display panel unable to have pixels distributed thereon. Therefore, a resolution of the OLED display panel is limited and is difficult to increase. Furthermore, because an underlay substrate of the OLED display panel is made of polyimide (PI) material with a limited flexible deformation capability (only 3% of deformation) such that a stretchable amount of the stretchable OLED display pane fails to achieve an ideal value, which extremely decreases pixels per inch (PPI) and deforming capability of the stretchable OLED display pane to limit applied fields of the stretchable OLED.

Therefore, it is necessary to provide a stretchable organic light emitting diode display panel to solve the issue of the prior art.

SUMMARY OF THE INVENTION

Technical Issue

Accordingly, the present invention provides a stretchable organic light emitting diode display panel to solve the technical issue of the prior art that a resolution of a stretchable organic light emitting diode (OLED) display panel is limited and difficult to increase such that a flexible deformation capability of the stretchable OLED display panel is too limited to make a stretchable amount to achieve an ideal value.

Technical Solution

An objective of the present invention is to provide an organic light emitting diode (OLED) display panel, comprising:

a display panel body comprising a flexible underlay substrate;

a plurality of first hole units defined through the display panel body, each of the first hole units comprising at least one through hole region intersected, and each of the first hole units comprising a middle through hole region and two side edge through hole regions, wherein the middle through hole region is longitudinal, the two side edge through hole regions are longitudinal and are connected respectively on two ends of the middle through hole region, the two side edge through hole regions are perpendicular to the middle through hole region, and each the first hole unit is a stretchable unit;

a plurality of bridge sets formed on the display panel body and corresponding to the first hole units, each of the bridge sets comprising a plurality of bridge units, the bridge units located adjacent to two sides of the middle through hole region of a corresponding one of the first hole units, wherein each of the bridge units is a wire unit; and a plurality of island sets formed on the display panel body and corresponding to the first hole units, each of the island sets comprising a plurality of island units, the island units located adjacent to the two side edge through hole regions of a corresponding one of the first hole units, wherein each of the island units is a light emitting and displaying unit.

In an embodiment of the present invention, the flexible underlay substrate is polydimethylsiloxane (PDMS).

In an embodiment of the present invention, the flexible underlay substrate is polydimethylsiloxane (PDMS), a portion of the flexible underlay substrate is a thermal curable portion with low elasticity, and a remaining portion of the flexible underlay substrate is a non-thermal curable portion with high elasticity.

In an embodiment of the present invention, a number of the bridge units of each of the bridge sets is two, the two bridge units are located respectively adjacent to the two sides of the middle through hole region of a corresponding one of the first hole units.

In an embodiment of the present invention, a number of the island units of each of the island sets is four, the four island units are located adjacent to distal ends of the side edge through hole regions of a corresponding one of the first hole units.

In an embodiment of the present invention, the organic light emitting diode display panel further comprises a plurality of second hole units defined through the display panel body, each of the second hole units comprises at least one through hole region intersected, and comprises a middle through hole region and two side edge through hole regions, the middle through hole region is longitudinal, the two side edge through hole regions are longitudinal and are connected respectively two ends of the middle through hole region, and the two side edge through hole regions are perpendicular to the middle through hole region.

In an embodiment of the present invention, the first hole units and the second hole units are staggered.

In an embodiment of the present invention, each of the first hole units is located between adjacent two of the second hole units.

In an embodiment of the present invention, each of the island units comprises the flexible underlay substrate, a barrier layer, a buffer layer, an active layer, a first gate insulation layer, a first gate metal layer, a second gate insulation layer, a second gate metal layer, a first interlayer dielectric layer, a second interlayer dielectric layer, a source and drain metal layer, a planarization layer, an anode layer, a light emitting device, a pixel definition layer, and a thin film encapsulation layer that are sequentially stacked on one another.

In an embodiment of the present invention, each of the bridge units comprises the flexible underlay substrate, a barrier layer, a metal wire layer, a planarization layer, a pixel definition layer, and a thin film encapsulation layer that are sequentially stacked on one another.

Another objective of the present invention is to provide an organic light emitting diode (OLED) display panel, comprising:

a display panel body comprising a flexible underlay substrate;

a plurality of first hole units defined through the display panel body, each of the first hole units comprising at least one through hole region intersected, and each of the first hole units comprising a middle through hole region and two side edge through hole regions, wherein the middle through hole region is longitudinal, the two side edge through hole regions are longitudinal and are connected respectively on two ends of the middle through hole region, the two side edge through hole regions are perpendicular to the middle through hole region, and each the first hole unit is a stretchable unit;

a plurality of bridge sets formed on the display panel body and corresponding to the first hole units, each of the bridge sets comprising a plurality of bridge units, the bridge units located adjacent to two sides of the middle through hole region of a corresponding one of the first hole units, wherein each of the bridge units is a wire unit; and a plurality of island sets formed on the display panel body and corresponding to the first hole units, each of the island sets comprising a plurality of island units, the island units located adjacent to the two side edge through hole regions of a corresponding one of the first hole units, wherein each of the island units is a light emitting and displaying unit;

wherein a number of the bridge units of each of the bridge sets is two, the two bridge units are located respectively adjacent to the two sides of the middle through hole region of a corresponding one of the first hole units;

wherein the organic light emitting diode display panel further comprises a plurality of second hole units defined through the display panel body, each of the second hole units comprises at least one through hole region intersected, and comprises a middle through hole region and two side edge through hole regions, the middle through hole region is longitudinal, the two side edge through hole regions are longitudinal and are connected respectively two ends of the middle through hole region, and the two side edge through hole regions are perpendicular to the middle through hole region.

In an embodiment of the present invention, a number of the island units of each of the island sets is four, the four island units are located adjacent to distal ends of the side edge through hole regions of a corresponding one of the first hole units.

In an embodiment of the present invention, the first hole units and the second hole units are staggered.

In an embodiment of the present invention, each of the first hole units is located between adjacent two of the second hole units.

In an embodiment of the present invention, each of the island units comprises the flexible underlay substrate, a barrier layer, a buffer layer, an active layer, a first gate insulation layer, a first gate metal layer, a second gate insulation layer, a second gate metal layer, a first interlayer dielectric layer, a second interlayer dielectric layer, a source and drain metal layer, a planarization layer, an anode layer, a light emitting device, a pixel definition layer, and a thin film encapsulation layer that are sequentially stacked on one another.

In an embodiment of the present invention, each of the bridge units comprises the flexible underlay substrate, a barrier layer, a metal wire layer, a planarization layer, a pixel definition layer, and a thin film encapsulation layer that are sequentially stacked on one another.

The hole unit of the stretchable OLED display panel of the present invention has the middle through hole region and the side edge through hole regions that are perpendicular to each other so the geometric shape thereof corresponds to the geometric shape of the island units, which facilitates distribution of a plurality of island units on a periphery of each of the hole units. Therefore, disposing of the hole units would not lower a number of the island units. Thus, the present invention can allow sufficient island units while increasing the stretchable amount of the organic light emitting diode display panel. In other words, the light emitting and displaying units are distributed on the OLED display panel to provide stretchable function of the stretchable OLED display panel while a high resolution thereof is maintained.

Advantages

Compared to the prior art, the stretchable OLED display panel of the present invention, by the hole units each having the at least one through hole region intersected, can improve deformation (stretching, spherical) of the OLED display panel. With PDMS underlay substrate and directional UV light curing technology, it can achieve a high-resolution OLED display panel with a highly stretchable PDMS underlay substrate. Furthermore, the present invention comprises the hole units each having the at least one through hole region intersected, which can increase at least 10% of a stretchable amount of the OLED display panel compared to the S-shaped hole units of the conventional stretchable display panel.

BRIEF DESCRIPTION OF THE SEVERAL VIEWS OF THE DRAWINGS

In order to make the above contents of the present invention clearer and more understandable, detailed descriptions of preferred embodiments in conjunction with the drawings will be presented as follows.

DESCRIPTION OF SPECIFIC EMBODIMENTS OF THE INVENTION

Figure 1:
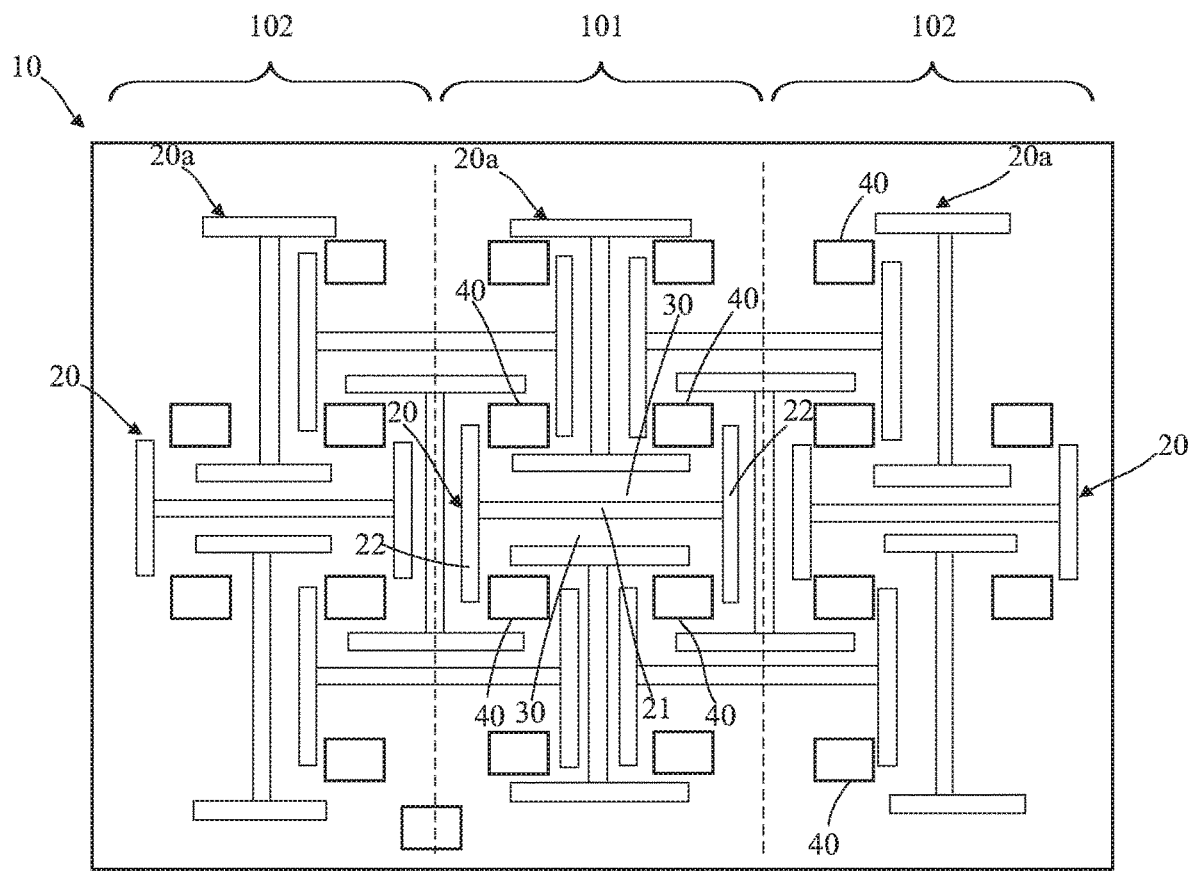
FIG. 1 is a top view of a stretchable organic light emitting diode display panel of the present invention.
Figure 2:
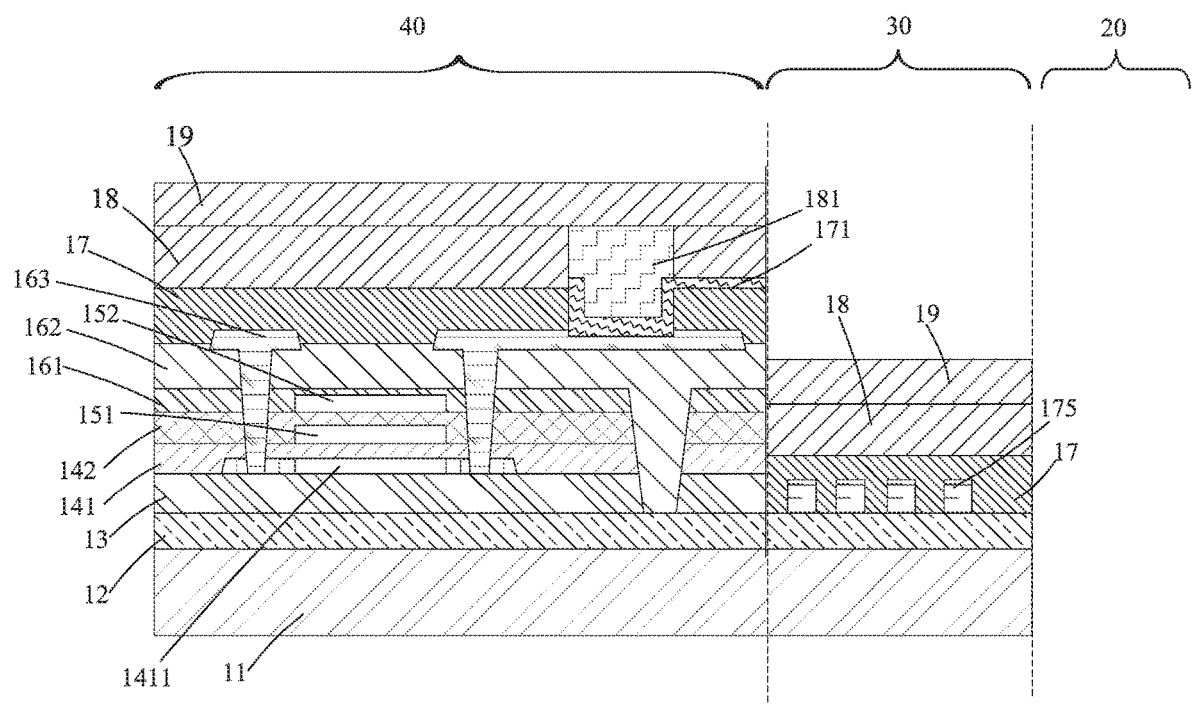
FIG. 2 is partially enlarged cross-sectional side view of a stretchable organic light emitting diode display panel of the present invention.

With reference to FIGS. 1 and 2, FIG. 1 is a top view of a stretchable organic light emitting diode display panel of the present invention. FIG. 2 is partially enlarged cross-sectional side view of a stretchable organic light emitting diode display panel of the present invention. The present invention organic light emitting diode (OLED) display panel, comprising: a display panel body 10, a plurality of first hole units 20, a plurality of bridge sets, a plurality of island sets, and a plurality of second hole units 20a.

The display panel body 10 comprises a flexible underlay substrate 11.

The first hole units 20 are defined through the display panel body 10. Each of the first hole units 20 comprises at least one through hole region intersected, the through hole region can be H-shaped, and the first hole unit 20 comprises a middle through hole region 21 and two side edge through hole regions 22. The middle through hole region 21 is longitudinal, the two side edge through hole regions 22 are longitudinal and are connected respectively to two ends of the middle through hole region 21. Furthermore, the two side edge through hole regions 22 are perpendicular to the middle through hole region 2, and each of the hole unit is a stretchable unit.

The bridge sets are formed on the display panel body 10 and correspond to the first hole units 20. Each of the bridge sets comprises a plurality of bridge units 30, and the bridge units 30 are located adjacent to two sides of the middle through hole region 21 of a corresponding one of the first hole units 20. Each of the bridge units 30 is a wire unit.

The island sets are formed on the display panel body 10 and correspond to the first hole units 20. Each of the island sets comprises a plurality of island units 40, the island units 40 are located adjacent to the two side edge through hole regions 22 of a corresponding one of the first hole units 20. Each of the island units 40 is a light emitting and displaying unit.

The second hole units 20a are defined through the display panel body 10, and each of the second hole units 20a comprises at least one through hole region intersected. The through hole region can be inverted-H-shaped, and comprises a middle through hole region 21 and two side edge through hole regions 22. The middle through hole region 21 is longitudinal, the two side edge through hole regions 22 are longitudinal and are connected respectively to two ends of the middle through hole region 21. Furthermore, the two side edge through hole regions 22 are perpendicular to the middle through hole region 21.

In an embodiment of the present invention, the display panel body 10 comprises a middle region 101 and two side edge regions 102 located respectively on two sides of the middle region. Arrangement of the first hole units 20, the bridge sets, the island sets, and the second hole units 20a is a bilateral symmetrical pattern according to the middle region 101 and the side edge regions 102.

In an embodiment of the present invention, the flexible underlay substrate 11 is polydimethylsiloxane (PDMS). Alternatively, in an embodiment of the present invention, the flexible underlay substrate 11 is polydimethylsiloxane (PDMS), and a portion of the flexible underlay substrate 11 is a thermal curable portion with lower elasticity, and a remaining portion of of the flexible underlay substrate 11 is a non-thermal curable portion with high elasticity.

In an embodiment of the present invention, a number of the bridge units 30 of each of the bridge sets is two, the two bridge units 30 are located respectively adjacent to the two sides of the middle through hole region 21 of the corresponding one of the first hole units 20. In an embodiment of the present invention, a number of the island units 40 of each of the island sets 的 is four, the four island units 40 are located adjacent to distal ends of the side edge through hole regions 22 of a corresponding one of the first hole units 20.

In an embodiment of the present invention, the first hole units 20 and the second hole units 20a are staggered.

In an embodiment of the present invention, each of the first hole units 20 is located between adjacent two of the second hole units 20a.

In an embodiment of the present invention, each of the island units 40 comprises the flexible underlay substrate 11, a barrier layer 12, a buffer layer 13, an active layer 1411, a first gate insulation layer 141, a first gate metal layer 151, a second gate insulation layer 142, a second gate metal layer 152, a first interlayer dielectric layer 161, a second interlayer dielectric layer 162, a source and drain metal layer 163, a planarization layer 17, an anode layer 171, a light emitting device 181, a pixel definition layer 18, and a thin film encapsulation layer 19 that are sequentially stacked on one another.

In an embodiment of the present invention, each of the bridge units 30 comprises the flexible underlay substrate 11, the barrier layer 12, a metal wire layer 175, the planarization layer 17, the pixel definition layer, and the thin film encapsulation layer 19 that are sequentially stacked on one another.

For a manufacturing method of the present invention OLED display panel, mainly the polyimide (PI) underlay substrate, the barrier layer 12, the buffer layer 13, the active layer 1411, the first gate insulation layer 141, the first gate metal layer 151, the second gate insulation layer 142, the second gate metal layer 152, the first interlayer dielectric layer 161, and the second interlayer dielectric layer 162 are sequentially stacked on one another. Then, regions to form the bridge units 30 and regions to form the hole units are etched to remove the buffer layer 13, the active layer 1411, the first gate insulation layer 141, the first gate metal layer 151, the second gate insulation layer 142, the second gate metal layer 152, the first interlayer dielectric layer 161, and the second interlayer dielectric layer 162. Then, regions to form the island units 40 are sequentially stacked with the source and drain metal layer 163, the planarization layer 17, the anode layer 171, the light emitting device 181, the pixel definition layer 18, and the thin film encapsulation layer 19. Furthermore, regions to form the bridge units 30 are sequentially stacked with the metal wire layer 175, the planarization layer 17, the pixel definition layer 18, and the thin film encapsulation layer 19. Then, regions to form the hole units are etched to define holes.

The H-shaped hole unit of the stretchable OLED display panel of the present invention has the middle through hole region 21 and the side edge through hole regions 22 that are perpendicular to each other so the geometric shape thereof corresponds to the geometric shape of the island units 40, which facilitates distribution of a plurality of island units 40 on a periphery of each of the hole units. Therefore, disposing of the H-shaped hole units would not lower a number of the island units 40. Thus, the present invention can allow sufficient island units 40 while increasing the stretchable amount of the organic light emitting diode display panel. In other words, the light emitting and displaying units are distributed on the OLED display panel to provide stretchable function of the stretchable OLED display panel while a high resolution thereof is maintained.

Compared to the prior art, the stretchable OLED display panel of the present invention, by the hole units each having the at least one through hole region intersected, can improve deformation (stretching, spherical) of the OLED display panel. With PDMS underlay substrate and directional UV light curing technology, it can achieve a high-resolution OLED display panel with a highly stretchable PDMS underlay substrate. Furthermore, the present invention comprises the hole units each having the at least one through hole region intersected, which can increase at least 10% of a stretchable amount of the OLED display panel compared to the S-shaped hole units of the conventional stretchable display panel.

What is claimed is:

1. An organic light emitting diode display panel, comprising:
   a display panel body comprising a flexible underlay substrate;
   a plurality of first hole units defined through the display panel body, each of the first hole units comprising at least one H-shaped through hole region, and each of the first hole units comprising a middle through hole region and two side edge through hole regions, wherein the middle through hole region is longitudinal, the two side edge through hole regions are longitudinal and are connected respectively on two ends of the middle through hole region, the two side edge through hole regions are perpendicular to the middle through hole region, and each of the first hole units is a stretchable unit;
   a plurality of bridge sets formed on the display panel body and corresponding to the first hole units, each of the bridge sets comprising a plurality of bridge units, the bridge units located adjacent to two sides of the middle through hole region of a corresponding one of the first hole units, wherein each of the bridge units is a wire unit; and
   a plurality of island sets formed on the display panel body and corresponding to the first hole units, each of the island sets comprising a plurality of island units, the island units located adjacent to the two side edge through hole regions of a corresponding one of the first hole units, wherein each of the island units is a light emitting and displaying unit;
   wherein each of the bridge units comprises the flexible underlay substrate, a barrier layer, a metal wire layer, a planarization layer, a pixel definition layer, and a thin film encapsulation layer that are sequentially stacked on one another.

2. The organic light emitting diode display pane 1 as claimed in claim 1, wherein the flexible underlay substrate is polydimethylsiloxane.

3. The organic light emitting diode display panel as claimed in claim 1, wherein the flexible underlay substrate is polydimethylsiloxane, a portion of the flexible underlay substrate is a thermal curable portion, and a remaining portion of the flexible underlay substrate is a non-thermal curable portion, and elasticity of the thermal curable portion of the flexible underlay substrate is less than elasticity of the non-thermal curable portion of the flexible underlay substrate is a non-thermal curable portion.

4. The organic light emitting diode display panel as claimed in claim 1, wherein a number of the bridge units of each of the bridge sets is two, the bridge units are located respectively adjacent to the two sides of the middle through hole region of a corresponding one of the first hole units.

5. The organic light emitting diode display panel as claimed in claim 1, wherein a number of the island units of each of the island sets is four, the island units are located adjacent to distal ends of the side edge through hole regions of a corresponding one of the first hole units.

6. The organic light emitting diode display panel as claimed in claim 1, wherein the organic light emitting diode display panel further comprises a plurality of second hole units defined through the display panel body, each of the second hole units comprises at least one inverted-H-shaped through hole region, and comprises a middle through hole region and two side edge through hole regions, the middle through hole region is longitudinal, the two side edge through hole regions are longitudinal and are connected respectively two ends of the middle through hole region, and the two side edge through hole regions are perpendicular to the middle through hole region.

7. The organic light emitting diode display panel as claimed in claim 6, wherein the first hole units and the second hole units are staggered.

8. The organic light emitting diode display panel as claimed in claim 6, wherein each of the first hole units is located between adjacent two of the second hole units.

9. An organic light emitting diode display panel, comprising:
   a display panel body comprising a flexible underlay substrate;
   a plurality of first hole units defined through the display panel body, each of the first hole units comprising at least one H-shaped through hole region, and each of the first hole units comprising a middle through hole region and two side edge through hole regions, wherein the middle through hole region is longitudinal, the two side edge through hole regions are longitudinal and are connected respectively on two ends of the middle through hole region, the two side edge through hole regions are perpendicular to the middle through hole region, and each of the first hole units is a stretchable unit;
   a plurality of bridge sets formed on the display panel body and corresponding to the first hole units, each of the bridge sets comprising a plurality of bridge units, the bridge units located adjacent to two sides of the middle through hole region of a corresponding one of the first hole units, wherein each of the bridge units is a wire unit; and
   a plurality of island sets formed on the display panel body and corresponding to the first hole units, each of the island sets comprising a plurality of island units, the island units located adjacent to the two side edge through hole regions of a corresponding one of the first hole units, wherein each of the island units is a light emitting and displaying unit;
   wherein a number of the bridge units of each of the bridge sets is two, the bridge units are located respectively adjacent to the two sides of the middle through hole region of a corresponding one of the first hole units;
   wherein the organic light emitting diode display panel further comprises a plurality of second hole units defined through the display panel body, each of the second hole units comprises at least one inverted-H-shaped through hole region, and comprises a middle through hole region and two side edge through hole regions, the middle through hole region is longitudinal, the two side edge through hole regions are longitudinal and are connected respectively two ends of the middle through hole region, and the two side edge through hole regions are perpendicular to the middle through hole region;
   wherein each of the bridge units comprises the flexible underlay substrate, a barrier layer, a metal wire layer, a planarization layer, a pixel definition layer, and a thin film encapsulation layer that are sequentially stacked on one another.

10. The organic light emitting diode display panel as claimed in claim 9, wherein a number of the island units of each of the island sets is four, the island units are located adjacent to distal ends of the two side edge through hole regions of a corresponding one of the first hole units.

11. The organic light emitting diode display panel as claimed in claim 9, wherein the first hole units and the second hole units are staggered.

12. The organic light emitting diode display panel as claimed in claim 9, wherein each of the first hole units is located between adjacent two of the second hole units.

* * * * *